(12) United States Patent
Nagase et al.

(10) Patent No.: US 8,227,710 B2
(45) Date of Patent: Jul. 24, 2012

(54) WIRING STRUCTURE OF PRINTED WIRING BOARD AND METHOD FOR MANUFACTURING THE SAME

(75) Inventors: Kenji Nagase, Tokyo (JP); Kenichi Kawabata, Tokyo (JP)

(73) Assignee: TDK Corporation, Tokyo (JP)

( * ) Notice: Subject to any disclaimer, the term of this patent is extended or adjusted under 35 U.S.C. 154(b) by 437 days.

(21) Appl. No.: 11/987,255

(22) Filed: Nov. 28, 2007

(65) Prior Publication Data

US 2008/0149379 A1    Jun. 26, 2008

(30) Foreign Application Priority Data

Dec. 22, 2006 (JP) ................................ 2006-346817

(51) Int. Cl.
  *H05K 1/11* (2006.01)
(52) U.S. Cl. ........ 174/263; 174/251; 174/267; 174/262; 361/774
(58) Field of Classification Search ............ 174/251, 174/267, 263; 361/774; 228/115
  See application file for complete search history.

(56) References Cited

U.S. PATENT DOCUMENTS

| | | | |
|---|---|---|---|
| 4,714,516 A | | 12/1987 | Eichelberger et al. |
| 4,818,728 A | * | 4/1989 | Rai et al. ................ 438/108 |
| 4,826,787 A | | 5/1989 | Muto et al. |
| 4,960,613 A | | 10/1990 | Cole et al. |
| 5,056,216 A | * | 10/1991 | Madou et al. ............... 29/843 |
| 5,279,711 A | * | 1/1994 | Frankeny et al. ........... 174/263 |
| 5,286,927 A | * | 2/1994 | Ueno et al. ................ 174/257 |
| 5,329,695 A | * | 7/1994 | Traskos et al. .............. 29/830 |
| 5,470,787 A | | 11/1995 | Greer |
| 5,477,086 A | | 12/1995 | Rostoker et al. |
| 5,537,740 A | * | 7/1996 | Shirai et al. .................. 29/852 |
| 5,796,591 A | * | 8/1998 | Dalal et al. ................ 361/779 |
| 5,985,521 A | | 11/1999 | Hirano et al. |
| 6,070,785 A | * | 6/2000 | Ameen et al. .............. 228/115 |
| 6,259,038 B1 | * | 7/2001 | Sakaguchi et al. .......... 174/261 |
| 6,407,345 B1 | | 6/2002 | Hirose et al. |

(Continued)

FOREIGN PATENT DOCUMENTS

EP     0 231 384 A1    8/1987

(Continued)

OTHER PUBLICATIONS

Oct. 8, 2009 Search Report issued in European Patent Application No. 07024790.3.

(Continued)

*Primary Examiner* — Tuan T Dinh
*Assistant Examiner* — Steven Sawyer
(74) *Attorney, Agent, or Firm* — Oliff & Berridge, PLC

(57) ABSTRACT

Provided is a wiring structure and the like which can completely connect a wiring layer to a body to be wired while keeping insulation between two adjacent wiring layers and realize high density packaging due to a narrowed pitch.
In a semiconductor-embedded substrate, a conductive pattern is formed on both sides of a core substrate and a semiconductor device is placed in a resin layer stacked over the core substrate. The resin layer has via-holes so that the conductive pattern and a bump of the semiconductor device protrude from the resin layer. Inside the via-holes, the bump and conductive pattern are respectively connected to via-hole electrode portions whose cross-sectional area has been increased toward the bottom of the via-hole. A void is defined between the via-hole electrode portion and upper portion of the inner wall of the via-hole.

18 Claims, 10 Drawing Sheets

U.S. PATENT DOCUMENTS

| | | | |
|---|---|---|---|
| 7,019,393 B2 * | 3/2006 | Toriyama | 257/692 |
| 2002/0066594 A1 * | 6/2002 | Shintani et al. | 174/261 |
| 2005/0032387 A1 | 2/2005 | Farnworth | |
| 2005/0161250 A1 | 7/2005 | Hiramoto | |
| 2008/0149379 A1 | 6/2008 | Nagase et al. | |

FOREIGN PATENT DOCUMENTS

| | | |
|---|---|---|
| EP | 0 238 066 A2 | 9/1987 |
| EP | 1 083 779 A1 | 3/2001 |
| EP | 1 936 677 A2 | 6/2008 |
| JP | A-60-234982 | 11/1985 |
| JP | A-05-021961 | 1/1993 |
| JP | A-6-132693 | 5/1994 |
| JP | A-08-222856 | 8/1996 |
| JP | A-09-246719 | 9/1997 |
| JP | A-2000-106478 | 4/2000 |
| JP | A-2001-274184 | 10/2001 |
| JP | A-2001-284814 | 10/2001 |
| JP | A-2003-243824 | 8/2003 |
| JP | A-2004-95695 | 3/2004 |
| JP | A-2005-064470 | 3/2005 |
| JP | A-2005-209920 | 8/2005 |
| JP | A-2006-100773 | 4/2006 |
| JP | A-2006-196656 | 7/2006 |
| WO | WO 02/47151 A2 | 6/2002 |

OTHER PUBLICATIONS

European Search Report for Application No. EP 08 00 1425, issued Sep. 30, 2009.
Mar. 16, 2011 Office Action issued in U.S. Appl. No. 12/007,830.
Aug. 4, 2011 Office Action issued in U.S. Appl. No. 12/007,830.

* cited by examiner (A)

(B)

(C)

(D)

(E)

(F)

(A)

(B)

(C)

(D)

WIRING STRUCTURE OF PRINTED WIRING BOARD AND METHOD FOR MANUFACTURING THE SAME

BACKGROUND OF THE INVENTION

The present invention relates to a wiring structure in a multilayer printed wiring board or component-embedded printed wiring board.

Multilayer printed wiring boards obtained by alternately stacking an insulating layer and a wiring layer and component-embedded printed wiring boards having an insulating layer with electronic component-embedded therein are known as a high density packaging structure of electronic components such as semiconductor IC chips. In printed wiring boards having such a structure, as a method for connecting a wiring layer to a body to be wired thereto such as an underlying wiring layer or an electrode of an embedded electronic component arranged below or inside the insulating layer, a method for forming, in the insulating layer, a connection hole which is called "via-hole" to expose therefrom the body to be wired and connecting the body to be wired and the wiring layer inside the via-hole (refer to Japanese Patent Laid-Open Nos. 2006-100773 and 2005-64470) is known.

For the manufacture of wiring structure, three processes are generally known. They are an additive process of selectively forming a wiring layer at a wiring pattern portion; a semi-additive process of forming a background layer over the entire surface of a substrate, selectively removing or masking a portion of the background layer other than the wiring pattern portion, and forming a wiring layer on the background layer which has remained or is exposed in the pattern form; and a subtractive process of forming a conductor layer over the entire surface of a substrate and then selectively removing a portion of the conductor layer other than a wiring pattern portion to form a wiring layer. These manufacturing processes of wiring structure are also employed commonly for the via-hole connection, that is, connection of a wiring layer and a body to be wired in a via-hole.

For example, there is disclosed in Japanese Patent Laid-Open No. 2006-100773 a process (subtractive process) of forming, in a multilayer printed wiring board, a conductor layer over the entire surface of a substrate including the inner wall of a via-hole, and selectively removing a portion of the conductor layer other than a wiring pattern portion by photolithography and etching to form the wiring pattern.

In Japanese Patent Laid-Open No. 2005-64470, there is disclosed a process (semi-additive process) of forming, in a component-embedded printed wiring board, an underlying conductive layer over the entire surface of a substrate including the inner wall of a via-hole, masking a portion of the underlying conductive layer other than a wiring pattern portion and carrying out electroplating with the exposed underlying conductive layer as a base to form the wiring pattern.

SUMMARY OF THE INVENTION

In either of the above-described manufacturing processes of wiring structure, misalignment may occur when a wiring layer is patterned. In order to allow such misalignment and ensure the connection of a wiring layer, a wiring structure in which the wiring layer is caused to extend from the outside of the upper portion of a via-hole to the surface of an insulating layer tends to be employed. This means that as illustrated in FIGS. 15A and 15B, in the conventional via-hole connection, there is a tendency to design it so as to make the width w of a wiring layer 153 formed on a via-hole 150 greater than an opening diameter r of the via-hole 150.

In this case, an insulation distance z between two adjacent wiring layers is, as illustrated in these drawings, the shortest distance between sites of them extending on the surface of the insulating layer. It is inevitable to widen the distance of two adjacent via-holes (via-hole pitch) to some extent in order to secure this insulation distance z sufficiently. Since a decrease in the arrangement distance of bodies to be wired needs a decrease in the via-hole pitch, high density packaging of a printed wiring board cannot be realized freely under the present situation.

For realizing high-density packaging, it is presumed to be effective to decrease the width of a wire itself and arrange wiring patterns at a narrow pitch, thereby ensuring a distance between wires (insulation distance). There is however a fear of failing to ensure complete connection of a wire and a body to be wired when misalignment occurs therebetween. Such a failure in connection leads to problems such as disconnection due to insufficient connection strength and an increase in the connection resistance to an undesirable level.

With the foregoing in view, the present invention has been made. An object of the present invention is to provide a wiring structure capable of ensuring the connection between a wiring layer and a body to be wired while maintaining insulation between two adjacent wiring layers, thereby achieving pitch reduction for high density packaging; and a manufacturing process thereof.

The present inventors have carried out an extensive investigation on the wiring structure of a via-hole connection. As a result, it has been found that the above-described object can be accomplished by forming, inside a connection hole in which a wiring layer and a body to be wired are connected, a structure in which the wiring layer widens toward the body to be wired, leading to the completion of the invention.

Described specifically, the wiring structure according to the present invention has an insulating layer having a connection hole formed therein, a body to be wired which is disposed on the bottom of the connection hole so as to expose at least a portion thereof, and a wiring layer connected to the body to be wired inside the connection hole. The wiring layer includes a portion whose cross-sectional area increases toward the body to be wired and at the same time, it is located so as to define a space region (void) between at least a portion of the inner wall of the connection hole and the wiring layer where they are not in contact.

The term "insulating layer" as used herein means a layer made of an electrically insulating material and it embraces, for example, an interlayer insulating layer in a multilayer printed wiring board or a component-embedded layer in a component-embedded printed wiring board. The term "body to be wired" means a subject body which is connected by a wiring layer, in other words, a body to be wired to a wire and it embraces, for example, an underlying wiring layer in a multilayer printed wiring board or an electrode of an embedded electronic component in a component-embedded printed wiring board. The term "wiring layer" means a layer constituting a wiring pattern for electrically connecting the body to be wired to another component mounted on a printed wiring board. The term "cross-sectional area" of the wiring layer means a cross-sectional area of it on a plane parallel to a plane defined by the opening ends of a connection hole. The term "inner wall" of the connection hole means a sidewall when the connection hole has, for example, a cup-like shape (cylindrical shape having one closed end) whose wall can be clearly divided into a side wall and a bottom wall, while it means "a wall portion other than a portion corresponding to the bottom portion" when the connection hole has a shape whose wall cannot be clearly divided into a side wall and a bottom wall.

In such a constitution, the wiring structure is formed by connecting the wiring layer to the body to be wired which is exposed from the bottom of a connection hole formed in the insulating layer. Inside the connection hole, the wiring layer has a portion whose cross-sectional area (which may be either a volume or cross-sectional width) increases gradually toward the body to be wired and a space region in which the inner wall of the connection hole and the wiring layer are not in contact is defined therebetween. In short, a wiring layer having a portion (for example, a portion like a mountain, trapezoid or pyramid with the proviso that the side wall surface thereof is not required to be flat) widening toward the bottom of the connection hole, in other words, having a portion tapered toward the opening ends of the connection hole is formed and a void is defined between the side wall of the wiring layer and the inner wall of the connection hole.

When connection holes which are adjacent to each other are formed and wiring layers having the above-described constitution are disposed in them, respectively, insulation between these wiring layers (between two adjacent wires in the wiring patterns) can be maintained by a distance between these connection holes. Since a large connection area can be secured at a connection site (that is, exposed surface of the body to be wired from the bottom of the connection hole) between the body to be wired and the wiring layer owing to the constitution of the wiring layer widening toward the body to be wired, the connection between the wiring layer and the body to be wired can be secured sufficiently even if there occurs misalignment between them during the patterning of the wiring layer.

The wiring layer includes a portion whose cross-sectional area widens toward the body to be wired and at the same time, a space region (concave portion) in which the inner wall of the connection hole and the wiring layer are not in contact is defined therebetween, in other words, a region not in contact with the wiring layer is defined from the opening end of the inner wall of the connection hole to the bottom side thereof so that the volume of the wiring layer corresponding to this void region can be reduced. This enables thinning of the entire wiring structure, which leads to a reduction in the amount of wire. As a result, it is possible to reduce the wire resistance and parasitic capacitance.

Moreover, since a void is defined between the inner wall of the connection hole and the wiring layer, the width of the wiring layer can be made not greater than the size of the connection hole. As a result, the width of the wiring layer can be controlled with a narrow allowance and the amount of wire can be reduced further, making it possible to reduce the wire resistance and parasitic capacitance of the entire wiring structure further. In addition, a void appears at least in the vicinity of the opening end portion in the connection hole during manufacturing of the wiring structure so that conductive foreign matters which may be mixed in near the wiring layer can be captured by this void and short-circuit between wiring layers which will otherwise be caused by them can be prevented.

In short, the wiring structure according to the present invention is equipped with an insulating layer having a connection hole formed therein, a body to be wired that is placed to expose at least a portion thereof from the bottom of the connection hole, and a wiring layer connected to the body to be wired inside the connection hole. The wiring layer is, in other words, disposed so as to define a space region in which at least a portion of the inner wall of the connection hole and the wiring layer are not in contact and which includes an opening end of the connection hole.

The entire portion of the wiring layer may be housed inside the connection hole or may protrude therefrom. In other words, the upper surface level of the wiring layer may be either lower or higher than the level of the opening end (open end) of the connection hole. In any case, it is preferred that the wiring layer widens toward the body to be wired and the width (maximum width in the cross-section parallel to the opening end face) of the wiring layer at the opening end of the connection hole is made smaller than the opening diameter (maximum width of the connection hole at the opening end) of the connection hole.

It is more preferred that the wiring layer is disposed to cover the entire surface of the body to be wired which is exposed from the bottom of the connection hole. This makes it possible to prevent a reduction in the wire strength or a rise in the connection resistance which will otherwise occur due to mixing of impurities in the interface between the wiring layer and body to be wired.

The printed wiring board according to the present invention is preferably equipped with the wiring structure of the present invention. It has a plurality of wiring structures formed therein, each wiring structure being equipped with an insulating layer having a connection hole formed therein, a body to be wired which is disposed below or inside the insulating layer so as to expose at least a portion thereof from the bottom of the connection hole, and a wiring layer connected to the body to be wired and including a portion whose cross-sectional area increases toward the body to be wired; and having, inside the connection hole, a space region in which the inner wall of the connection hole and the wiring layer are not in contact.

The method for manufacturing a wiring structure according to the present invention is a process for effectively fabricating the wiring structure of the present invention. It has steps of forming an insulating layer on a body to be wired, forming at least one connection hole in the insulating layer so as to expose at least a portion of the body to be wired therefrom, and connecting the body to be wired and the wiring layer inside the connection hole, wherein in the step of connecting the wiring layer, the wiring layer and the body to be wired are connected so that inside the connection hole, the cross-sectional area of the wiring layer increases toward the body to be wired and at the same time, a space region in which the inner wall of the connection hole and the wiring layer are not in contact is defined therebetween.

The wiring structure and the like according to the present invention make it possible to completely connect a wiring layer and a body to be wired while maintaining insulation between two adjacent wiring layers even if the pitch of connection holes such as via-holes is decreased. A decrease in the pitch of connection holes contributes to the realization of high density packaging of a printed wiring board or the like.

DETAILED DESCRIPTION OF THE INVENTION

Figure 1:
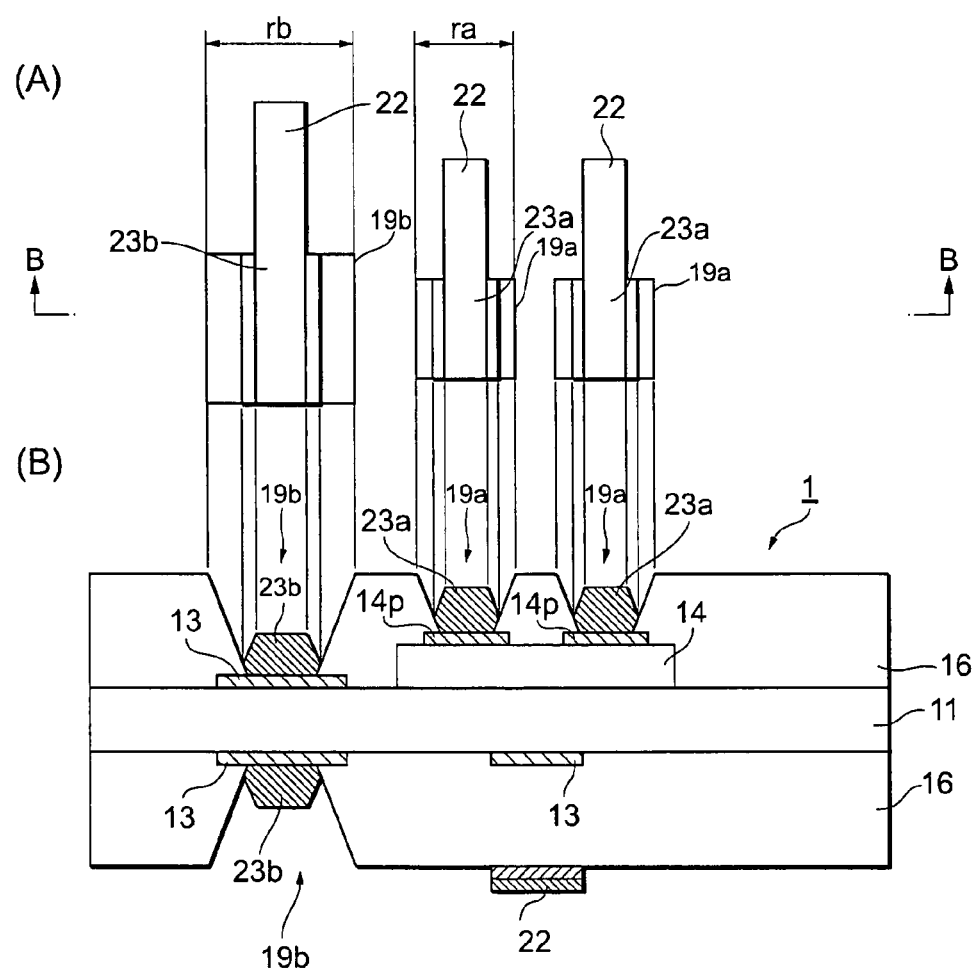
FIGS. 1A and 1B are respectively a fragmentary schematic plan view and cross-sectional view illustrating one example of semiconductor-embedded substrates having a preferred wiring structure according to the present invention.

Embodiments of the present invention will next be described specifically. In all the drawings, elements having like function are identified by like reference numerals and overlapping descriptions are omitted. The positional relationship in the left-right or up-down direction is based on the positional relationship shown in these drawings unless otherwise specifically indicated. The dimensional ratio is not limited to that in the drawings. The following embodiments are shown not for limiting the invention but only for explaining the present invention. Moreover, the present invention can be modified in various ways insofar as they do not depart from the scope of the invention.

FIG. 1A is a fragmentary schematic plan view illustrating one example of semiconductor-embedded substrates having one preferred wiring structure according to the present invention; and FIG. 1B is a cross-sectional view taken along a line B-B of FIG. 1A.

In a semiconductor-embedded substrate 1 (printed wiring board), a conductive pattern 13 (a body to be wired) is formed on both sides of a core substrate 11 and a semiconductor device 14 is placed in a resin layer 16 stacked over the core substrate 11. The resin layer 16 has via-holes 19a and 19b (connection holes) therein so that the conductive pattern 13 and a bump 14p (body to be wired) of the semiconductor device 14 placed below/above (on the side of the core substrate 11) and inside the resin layer 16 protrude from the resin layer 16. Inside the via-holes 19a and 19b, the bump 14p and conductive pattern 13 are connected to via-hole electrode portions 23a and 23b (both, wiring layers) of conductive patterns 22, respectively.

The via-hole electrode portions 23a and 23b include a portion having a trapezoidal cross-section as illustrated in the drawing. In other words, the substantially upper half portion of the via-hole electrode portion widens toward the conductive pattern 13 and bump 14p so as to increase the cross-sectional area. They are, on both sides thereof, in contact with the vicinity of the bottom portion on the inner wall of the via-holes 19a and 19b and are not in contact thereabove, whereby a space region (void) is defined between the inner walls of the via-holes 19a and 19b and via-hole electrode portions 23a and 23b, respectively. Moreover, the via-hole electrode portions 23a and 23b are, at the end of the slope of the side walls thereof, brought into contact with the side wall surfaces of the via-holes 19a and 19b, respectively.

The core substrate 11 serves as a base material for ensuring the mechanical strength of the entirety of the semiconductor-embedded substrate 1. Although no particular limitation is imposed on it, a resin substrate or the like can be employed. As a material of a resin substrate, use of a material obtained by impregnating a core material made of a resin cloth such as glass cloth, Kevlar fiber, aramid fiber or liquid crystalline polymer or a porous sheet of a fluorine resin in a thermosetting resin or thermoplastic resin is preferred. The material has a thickness of preferably from about 20 µm to 200 µm. When a substrate is subjected to laser processing, a sheet material free of a core material such as LCP, PPC, PES, PEEK or PI may be employed in order to carry out laser processing under uniform conditions.

Figure 14:
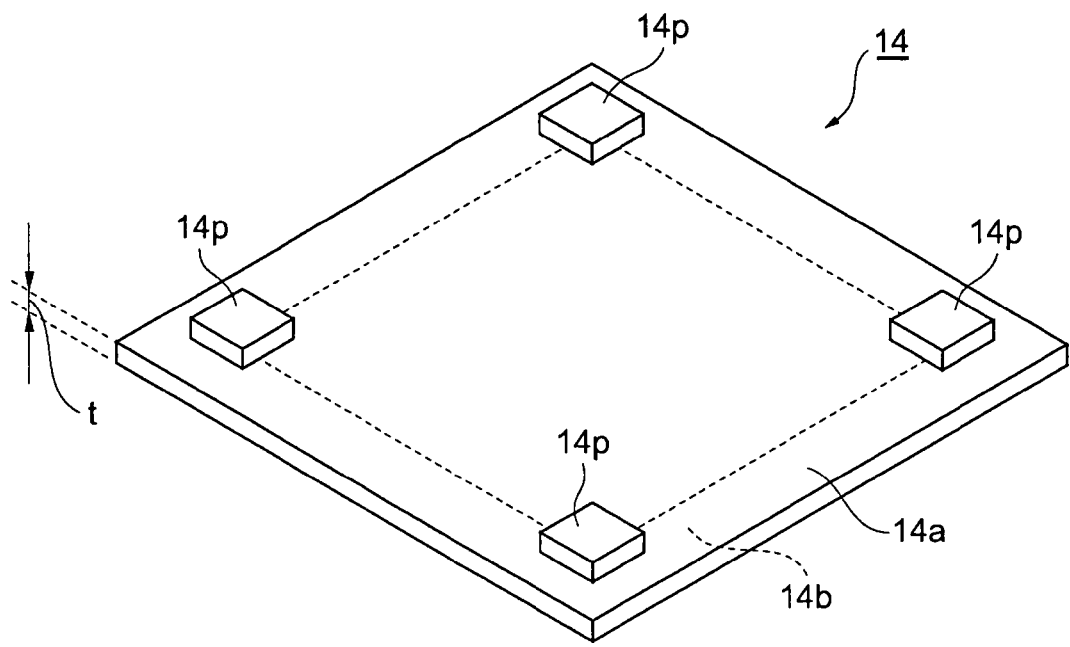
FIG. 14 is a perspective view illustrating the schematic structure of the semiconductor device.
Figure 15:
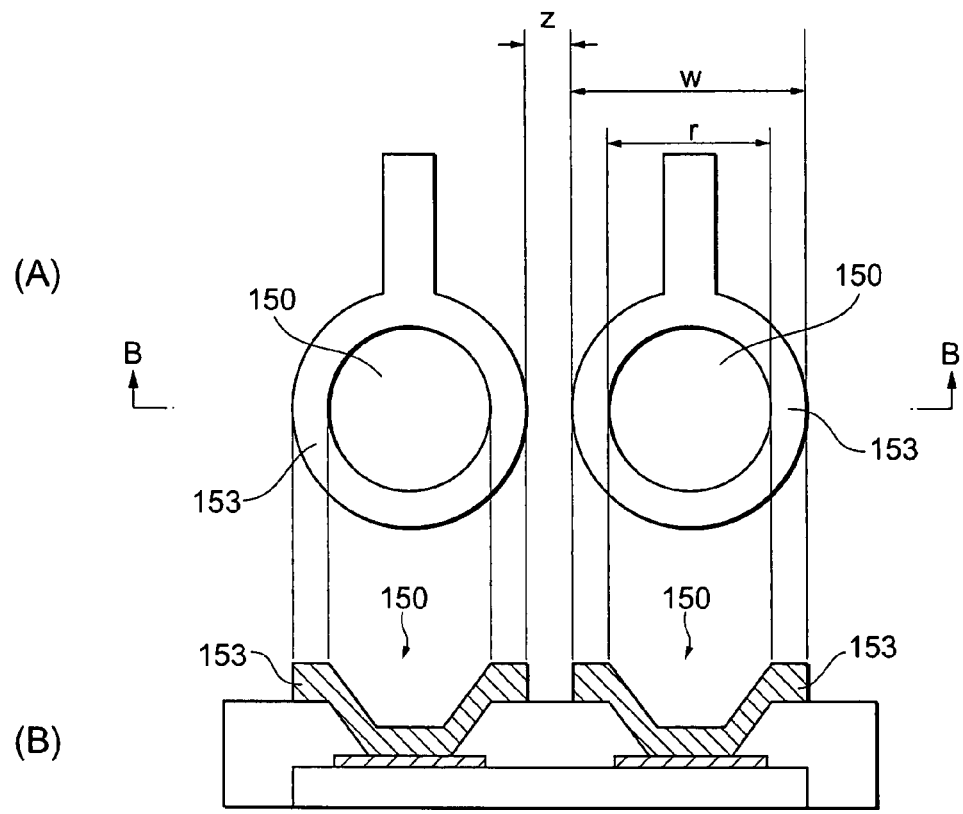
FIGS. 15A and 15B are a plan view and a cross-sectional view illustrating one example of a conventional wiring structure, respectively.

In this embodiment, the semiconductor device 14 is a semiconductor component such as semiconductor IC (die) in the form of a bare chip. FIG. 14 is a perspective view illustrating the schematic structure of the semiconductor device 14. The semiconductor device 14 has many land electrodes (not illustrated) and bumps 14p bonded thereonto on a main surface 14a having a substantially rectangular shape. In this drawing, only the bumps 14 on four corners are shown and the other bumps are omitted.

The back surface 14b of the semiconductor device 14 has been polished, though not particularly limited, whereby the thickness t (distance from the main surface 14a to the back surface 14b) of the semiconductor device 14 is smaller than that of a -conventional semiconductor device. The thickness is, for example, preferably 200 µm or less, more preferably from about 10 to 100 µm. The back surface 14b is preferably subjected to roughening treatment by etching, plasma treatment, laser irradiation, blasting, buffing or chemical treatment in order to thin the semiconductor device 14 further.

With regards to the polishing of the back surface 14b of the semiconductor device 14, it is preferred to polish a large number of the semiconductor devices 14 simultaneously while it is in the form of a wafer and then dicing the wafer into individual semiconductor devices 14. When the wafer is diced into the individual semiconductor devices 14 prior to thinning by polishing, the back surface 14b can be polished while covering the main surface 14a of the semiconductor device 14 with a resin or the like.

No particular limitation is imposed on the kind of the bumps 14p and various bumps such as stud bump, plate bump, plated bump and ball bump can be employed. In the drawing, a plate bump is illustrated as an example.

When a stud bump is employed as the bump 14p, a silver (Ag), copper (Cu) or gold (Au) stud bump can be formed by wire bonding. When a plate bump is employed, it can be formed by plating, sputtering or vapor deposition. When a plated bump is employed, it can be formed by plating. When a ball bump is employed, it can be prepared by melting a solder ball laid on a land electrode or a cream solder printed on a land electrode. A bump obtained by curing a screen-printed conductive material into a conical or cylindrical shape or a bump obtained by printing a nanopaste and sintering it by heating can also be employed.

No particular limitation is imposed on the kind of a metal usable for the bump 14p and examples include gold (Au), silver (Ag), copper (Cu), nickel (Ni), tin (Sn), chromium (Cr), nickel chromium alloy, and solder. Of these, copper is preferred. When the bump 14p is made of copper, a bonding strength to the land electrode can be raised compared with that made of gold and a higher bonding strength leads to improvement in the reliability of the semiconductor device 14.

The size and shape of the bump 14p can be determined as needed depending on the distance (pitch) between land electrodes. When the pitch between land electrodes is about 100 µm, the bump 14p may be adjusted to have a maximum diameter from about 10 to 90 µm and height from about 2 to 100 µm. The bumps 14 can be bonded to land electrodes by using a wire bonder after the wafer is diced into individual semiconductor devices 14.

The resin layer 16 is an insulating layer for electrically insulating the conductive pattern 13 and semiconductor device 14 from the outside. Examples of materials used for it include single substances such as vinyl benzyl resin, polyvinyl benzyl ether compound resin, bismaleimide triazine resin (BT resin), polyphenylene ether (polyphenylene ether oxide) resin (PPE, PPO), cyanate ester resin, epoxy+active ester cured resin, polyphenylene ether resin (polyphenylene oxide resin), curable polyolefin resin, benzocyclobutene resin, polyimide resin, aromatic polyester resin, aromatic liquid-crystalline polyester resin, polyphenylene sulfide resin, polyetherimide resin, polyacrylate resin, polyether ether ketone resin, fluorine resin, epoxy resin, phenol resin and benzoxazine resin; materials added, to these resins, silica, talc, calcium carbonate, magnesium carbonate, aluminum hydroxide, magnesium hydroxide, aluminum borate whisker, potassium titanate fibers, alumina, glass flakes, glass fibers, tantalum nitride or aluminum nitride; materials obtained by adding, to these resins, a metal oxide powder containing at least one metal selected from the group consisting of magnesium, silicon, titanium, zinc, calcium, strontium, zirconium, tin, neodymium, samarium, aluminum, bismuth, lead, lanthanum, lithium and tantalum; materials obtained by incorporating, in these resins, glass fibers or resin fibers such as glass fibers; and materials obtained by impregnating a glass cloth, aramid fibers, nonwoven fabric or the like in these resins. From them, a proper one can be selected as needed from the viewpoints of electrical properties, mechanical properties, water absorption and reflow resistance. Although no limitation is imposed on the thickness of the resin layer 16, it is usually from about 10 to 100 µm.

The via-holes 19a and 19b are connection holes formed in the resin layer 16 in order to physically connect a body to be wired such as conductive pattern 13 or semiconductor device 14 to the conductive pattern 22 and their position and depth are enough for permitting exposure of at least a portion of the conductive pattern 13 or the bump 14p of the semiconductor device 14 from the resin layer 16. In other words, the conductive pattern 13 and bump 14 are placed so as to expose at least a portion of them from the bottom of the via-holes 19a and 19b.

Although no limitation is imposed on the forming method of the via-holes 19a and 19b, known methods such as laser processing, etching and blasting can be employed. Laser processing is accompanied with generation of smear. The desmear process is therefore preferably conducted after formation of the connection hole.

The via-holes 19a and 19b may have any shape or size insofar as they enable physical connection between the conductive pattern 13 and bump 14p and the via-hole electrode portions 23a and 23b inside the via-holes. They can be determined as needed after due consideration of their depth or intended packaging density and connection stability. They are, for example, circular cylindrical holes having a diameter, at an opening end thereof, from about 5 to 200 µm or square cylindrical ones having a maximum diameter from 5 to 200 µm. They are not required to be a straight cylindrical hole. In the drawing, via-holes with an inverted pyramid shape are shown by way of example. Such via-holes 19a and 19b having a gradually increased diameter from the bottom portion toward the opening end can be obtained by boring by etching or blasting.

The conductive pattern 22 is a wiring layer electrically connected to a body to be wired such as the conductive pattern 13 or bump 14. No particular limitation is imposed on the material of the conductive pattern 22 and conductors ordinarily employed for wire such as metal can be employed. The material of the conductive pattern 22 may be the same as or different from the material used for the formation of the conductive pattern 13 or bump 14p. When the formation process of the conductive pattern 22 includes an etching step, an etchant (etching solution in wet etching or etchant particles in dry etching) is selected as needed from materials which do not etch the material of the conductive pattern 13 or bump 14p.

Although no particular limitation is imposed on the thickness of the conductive pattern 22, it is typically from about 5 to 70 µm because an excessively small thickness leads to deterioration in connection stability. The thickness of the conductive pattern 22 is preferably made smaller than the depth of the via-hole 19a or 19b as in this Embodiment because if so, the conductive patterns 22 (via-hole electrode portions 23a and 23b) are housed inside the via-holes 19a and 19b at the via-hole connection portions so that the wire height decreases. This contributes to not only thinning but also reduction in the amount of wire, thereby reducing the wire resistance and parasitic capacitance and moreover, enhancing connection stability.

One example of manufacturing processes of the semiconductor-embedded substrate 1 will next be explained referring to some drawings. FIGS. 2 to 11 illustrate one example of manufacturing steps of a semiconductor-embedded substrate 1.

Figure 2:
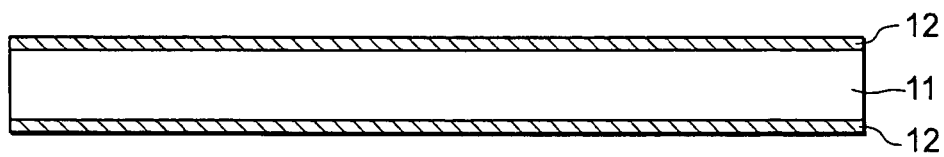
FIG. 2 illustrates one example of a manufacturing step of a semiconductor-embedded substrate 1.

First, a resin substrate obtained by attaching a copper foil 12 to both sides of a core substrate 11 is prepared (FIG. 2). The copper foil 12 is used for the formation of a conductive pattern 13 and use of an electrolyte copper foil (a copper foil obtained by continuously electrodepositing ionized copper in an aqueous solution of copper sulfate while using an electrodeposition roll) or rolled copper foil prepared for a printed wiring board makes it possible to reduce fluctuations of the thickness as small as possible. The thickness of the copper foil 12 can also be adjusted by sweeping or the like as needed.

Figure 3:
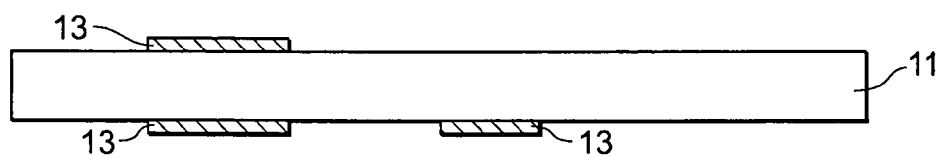
FIG. 3 illustrates one example of a manufacturing step of the semiconductor-embedded substrate 1 following that of FIG. 2.

The conductive pattern 13 is formed on the core substrate 11 by selectively removing the copper foil 12 attached to both sides of the core substrate 11 by photolithography and etching (FIG. 3). At this time, a region in which the semiconductor device 14 is to be loaded is secured by removing the copper foil 12 completely from a predetermined region on the core substrate 11.

Figure 4:
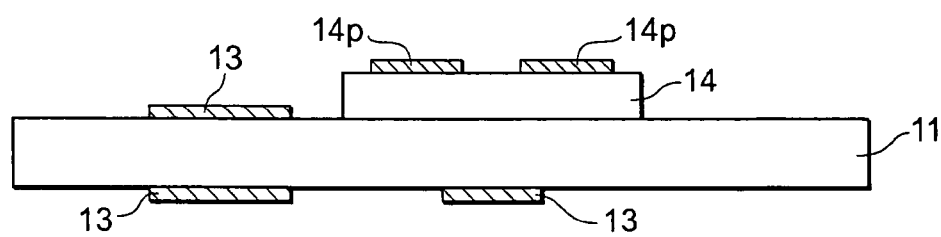
FIG. 4 illustrates one example of a manufacturing step of the semiconductor-embedded substrate 1 following that of FIG. 3.

Next, the semiconductor device 14 is laid in the predetermined region on the core substrate 11 in a so-called face up position (FIG. 4). It is preferred to temporarily fix the semiconductor device 14 onto the core substrate 11 with an adhesive or the like.

Figure 5:
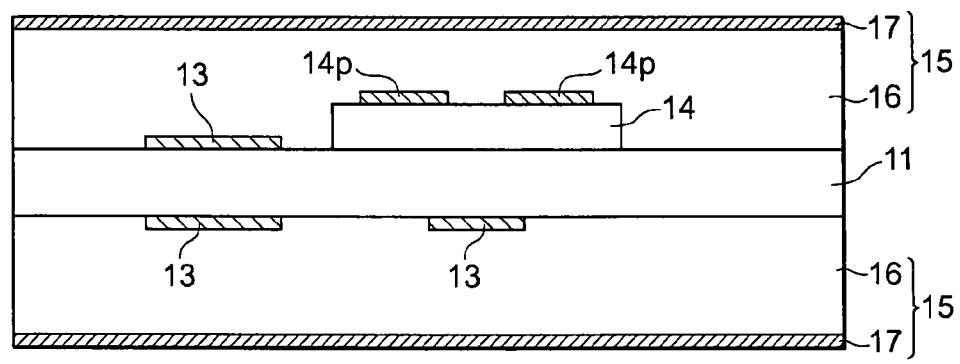
FIG. 5 illustrates one example of a manufacturing step of the semiconductor-embedded substrate 1 following that of FIG. 4.

A resin sheet 15 having, on one side thereof, a copper foil is attached to both sides of the core substrate 11 having the semiconductor device 14 placed thereon (FIG. 5). The resin sheet 15 having, on one side thereof, a copper foil, which is used in this manufacturing example, is obtained by attaching a copper foil 17 attached on one side of a thermosetting resin sheet 16 made of a B-stage epoxy resin or the like. After such a resin sheet 15 having, on one side thereof, a copper foil is prepared and the resin surface of the sheet is attached to each of both sides of the core substrate 11, the resin sheet 15 and core substrate 11 are integrated together by hot pressing, whereby the semiconductor device 14 is embedded in the printed wiring board and the thermosetting resin sheet 16 becomes a resin layer 16 (insulating layer formation step).

Figure 6:
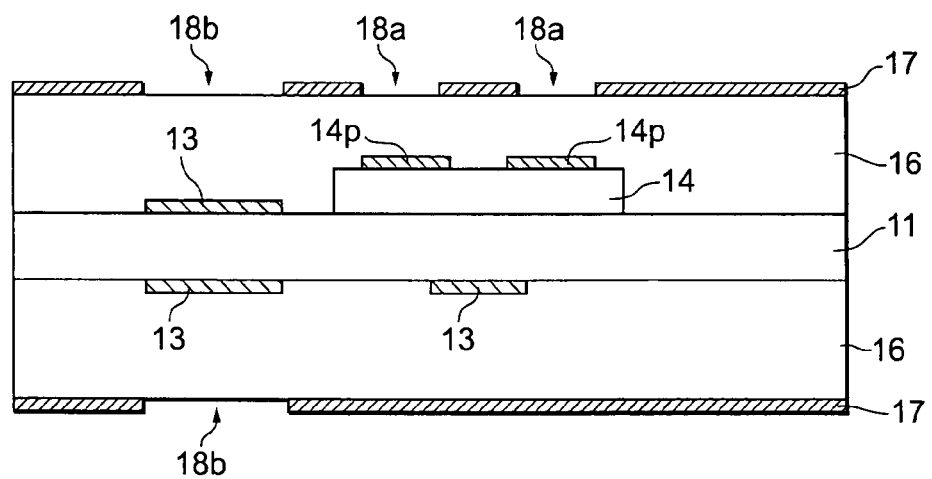
FIG. 6 illustrates one example of a manufacturing step of the semiconductor-embedded substrate 1 following that of FIG. 5.

The copper foil 17 on the surface of the resin layer 16 is then selectively removed by conformal processing to form mask patterns for the formation of via-holes 19a and 19b (FIG. 6). For accomplishing high precision microfabrication, it is preferred to carry out conformal processing while utilizing photolithography and etching. Although no particular limitation is imposed on the opening diameter of the mask pattern, that from about 10 to 200 µm is preferred and the opening diameter is preferably increased, depending on the depth of the via-holes 19a and 19b. In this step, an opening pattern 18a is formed just above the bump 14p of the semiconductor device 14, while an opening pattern 18b is formed just above the conductive pattern 13 formed on the surface of the core substrate 11.

Figure 7:
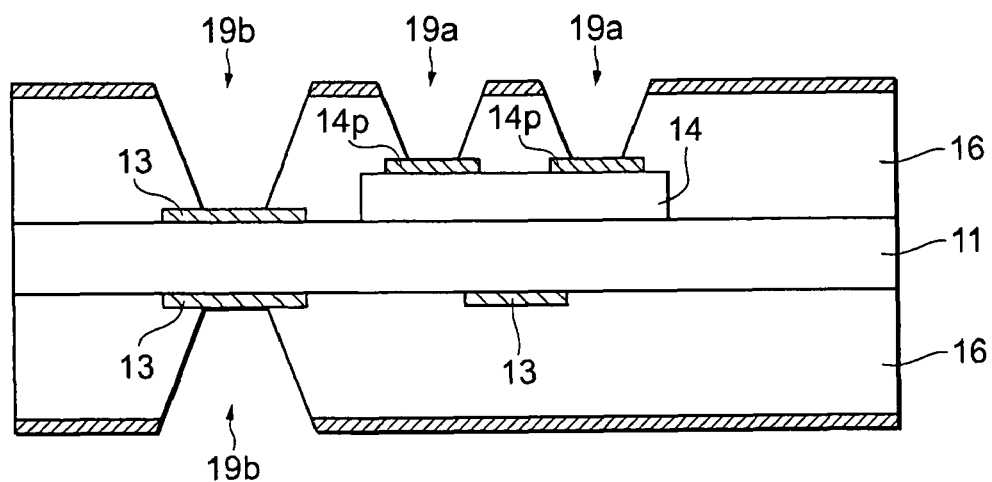
FIG. 7 illustrates one example of a manufacturing step of the semiconductor-embedded substrate 1 following that of FIG. 6.

Via-holes 19a and 19b are then formed by sand blasting with the copper foil 17 subjected to conformal processing as a mask (FIG. 7). In this sand blasting, blast particles such as non-metal particles or metal particles are injected for grinding. Via-holes different in depth can be formed respectively by disposing metal layers such as bump 14p and conductive pattern 13 just below the opening patterns 18a and 18b. The bump 14p functioning as a stopper in the formation of the via-hole 19a can prevent the semiconductor device 14 from being damaged by the blast particles, while the inner conductive pattern 13 functioning as a stopper in the formation of the via-hole 19b can prevent the via-hole 19b being etched further. Thus, the via-holes 19a and 19b are blind ones and the bump 14p and conductive pattern 13 are exposed from the bottom of the via-holes 19a and 19b, respectively (connection hole formation step).

Figure 8:
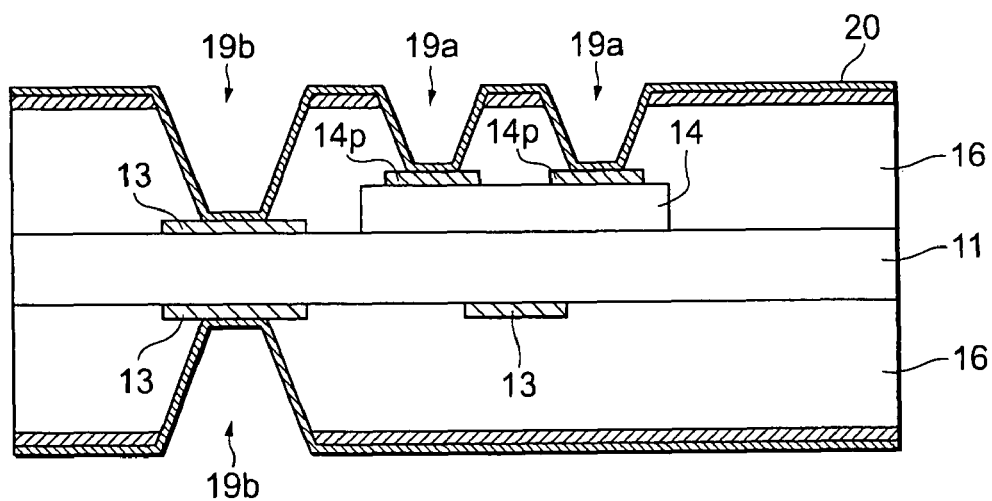
FIG. 8 illustrates one example of a manufacturing step of the semiconductor-embedded substrate 1 following that of FIG. 7.
Figure 9:
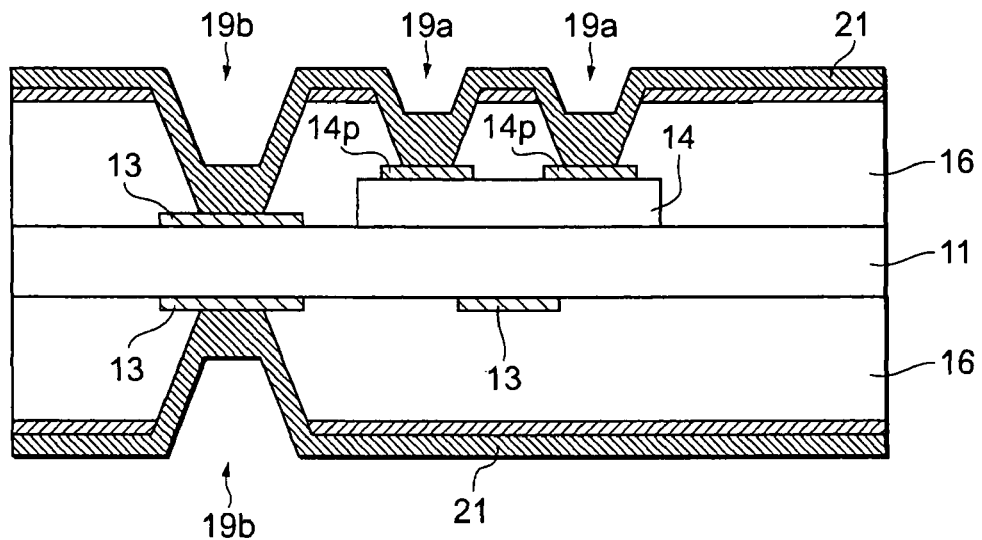
FIG. 9 illustrates one example of a manufacturing step of the semiconductor-embedded substrate 1 following that of FIG. 8.

An underlying conductive layer 20 is formed over almost the entire exposed surface in the via-holes 19a and 19b including the inner wall surface of the via-holes 19a and 19 (FIG. 8). The underlying conductive layer 20 is formed preferably by electroless plating (chemical plating), but sputtering, vapor deposition or the like method can also be employed. The underlying conductive layer 20 plays a role as an underlying metal (or seed layer) for electrolytic plating (electroplating) which will be performed later. It is not required to be thick and for example, its thickness is selected as needed from a range of from several tens of nm to several µm. Electrolytic plating is then performed to grow a conductor metal from the underlying conductive layer 20 (FIG. 9), whereby a conductive layer 21 including the underlying conductive layer 20 is formed on the inner wall surfaces of the via-holes 19a and 19b.

Figure 10:
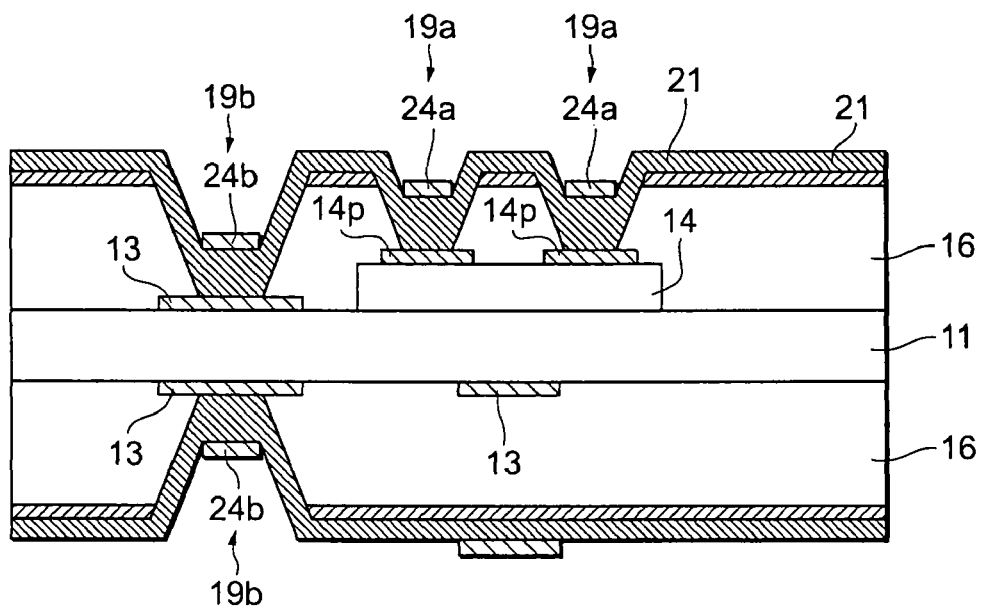
FIG. 10 illustrates one example of a manufacturing step of the semiconductor-embedded substrate 1 following that of FIG. 9.

Resist layers 24a and 24b are then formed by photolithography over regions of the conductive layer 21 which will be conductive patterns 22 (FIG. 10). In order to form via-hole electrode portions 23a and 23b of the conductive pattern 22 so as not to bring them into contact with the inner walls of the via-holes 19a and 19b, these resist layers 24a and 24b are formed so that the widths of the resist layers 24a and 24b in the via-holes 19a and 19b will be smaller than the upper opening diameters ra and rb of the via-holes.

Figure 11:
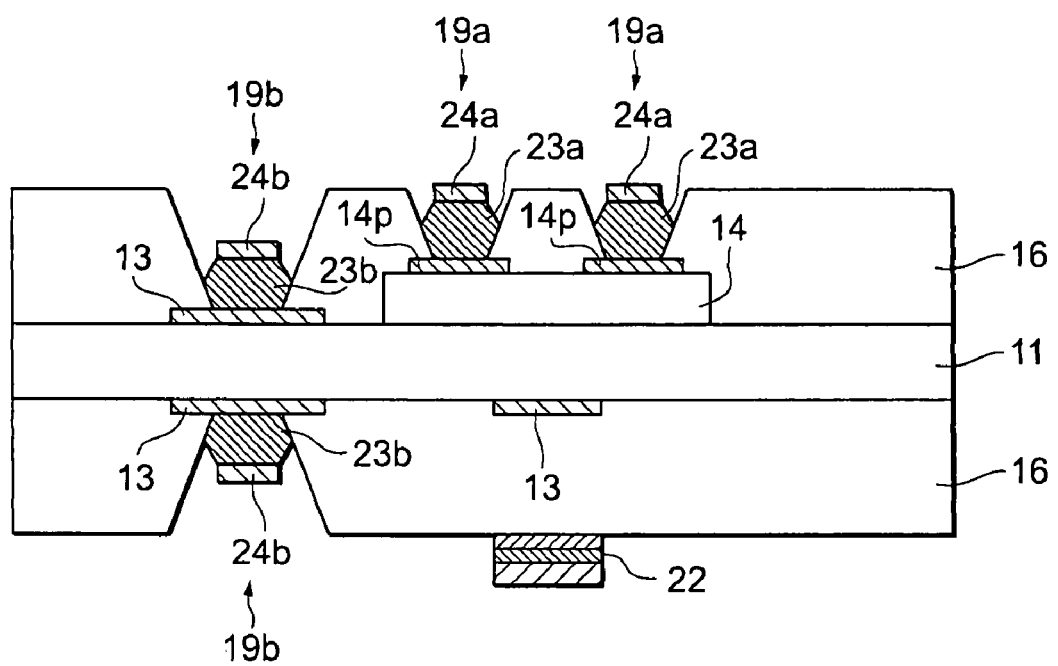
FIG. 11 illustrates one example of a manufacturing step of the semiconductor-embedded substrate 1 following that of FIG. 10.

With the resist layers 24a and 24b as an etching mask, the conductive layer 21 is selectively removed from a region other than the wiring pattern portions by etching to form conductive patterns 22 (via-hole electrode portions 23a and 23b) (FIG. 11: wiring layer connection step). The etching rate of the conductive layer 21 in the vicinity of the mask becomes smaller than that of the other region so that the upper portions of the via-hole electrode portions 23a and 23b which are wiring layers thus formed each becomes wider than the lower portions.

The resist layers 24a and 24b on the conductive patterns 22 are removed by a stripping solution, whereby the semiconductor-embedded substrate 1 having the constitution as shown in FIG. 1 is obtained.

According to the semiconductor-embedded substrate 1 of the present invention equipped with such a wiring structure, the via-hole electrode portions 23a and 23b include portions whose cross-sectional area increases gradually toward the conductive pattern 13 and bump 14p inside the via-holes 19a and 19b and space regions in which the inner walls of the via-holes 19a and 19b and the via-hole electrode portions 23a and 23b are not in contact, respectively, are defined so that insulation between two adjacent via-holes 19a and 19a or insulation between two adjacent via-holes 19a and 19b can be maintained due to a distance therebetween. Accordingly, complete connection between the conductive pattern 13 and the via-hole electrode portion 23b and the bump 14p and the via-hole electrode portion 23a can be ensured while maintaining the insulation between the two adjacent via-holes 19a and 19a and two adjacent via-holes 19a and 19b. This enables high density packaging of the semiconductor-embedded substrate 1 due to decrease in the pitch of the via-holes 19a and 19a or 19a and 19b.

In addition, since the via-hole electrode portions 23a and 23b are wider in the upper portion than in the lower portion, a large connection area can be secured at a connection site between the conductive pattern 13 and via-hole electrode portion 23b or between the bump 14p and the via-hole electrode portion 23a (exposed surface of the conductive pattern 13 and bump 14p from the bottom of the via-holes 19b and 19a), via-hole electrode portions 23a and 23b and bump 14p and conductive pattern 13 can be connected respectively with a sufficient area even if misalignment occurs among them in the patterning of the via-hole electrode portions 23a and 23b. This makes it possible to secure a sufficient connection strength between the via-hole electrode portions 23a and 23b and bump 14p and conductive pattern 13, respectively, thereby preventing disconnection or a rise in the connection resistance and improving the reliability and productivity of the product.

Moreover, the via-hole electrode portions 23a and 23b include portions whose cross-sectional areas increase toward the bump 14p and conductive pattern 13, respectively, and space regions (concave portions) in which the inner walls of the via-holes 19a and 19b and via-hole electrode portions 23a and 23b are not in contact are defined between them so that a volume of the wiring layer corresponding to this void decreases, leading to thinning of the entire wiring structure. In addition, owing to such a decrease in the amount of wire, the wire resistance and parasitic capacitance can be reduced.

Furthermore, a void is defined between the inner walls of the via-hole electrode portions 23a and 23b and bump 14p and conductive pattern 13, respectively, so that the width of the via-hole electrode portions 23a and 23b can be made not greater than the size of the via-holes 19a and 19b. This makes it possible to control the width of the via-holes 19a and 19b at a narrow tolerance and at the same time, the wire resistance and parasitic capacitance of the entire wiring structure can be reduced further owing to a further reduction in the amount of wire. A void appears at least in the vicinity of the opening end portion in the via-holes 19a and 19b during manufacturing of the wiring structure so that conductive foreign matters mixed, if any, in near the via-hole electrode portions 23a and 23b can be captured by this void, whereby short-circuit between the via-hole electrode portions 23a and 23b due to foreign matters can be prevented.

Owing to the void defined between the inner walls of the via-hole electrode portions 23a and 23b and bump 14p and conductive pattern 13, respectively, adhesion between the insulating layer 16 and another material stacked over the insulating layer 16 by a build-up process or solder resist can be enhanced by an anchor effect of the void.

Figure 12:
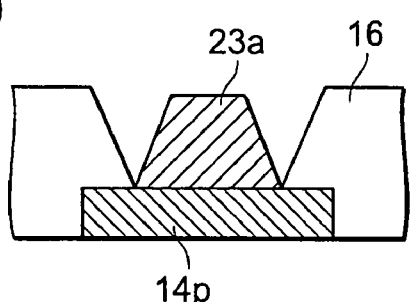
FIGS. 12A to 12F are cross-sectional views illustrating wiring layers according to other embodiments of the wiring structure of the present invention, respectively.
Figure 12:
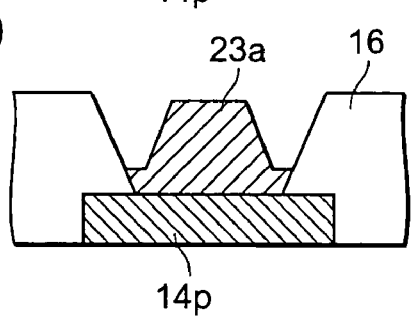
Figure 12:
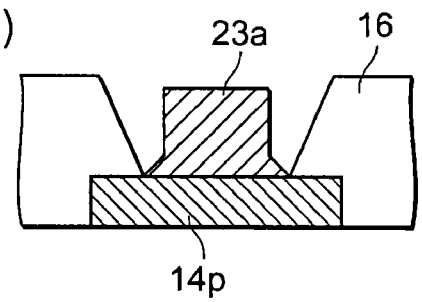
Figure 12:
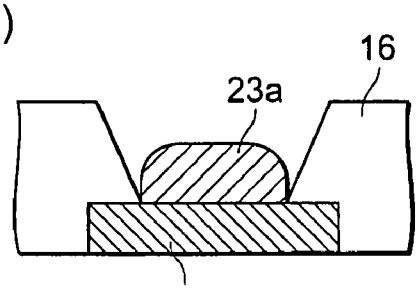
Figure 12:
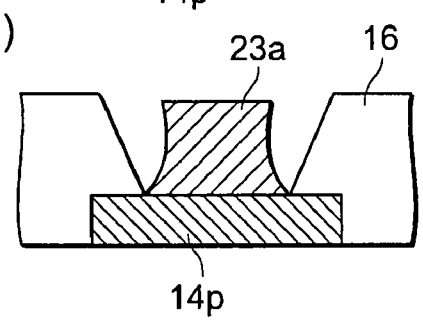
Figure 12:
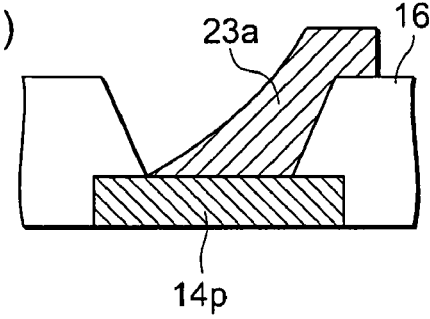

Other formation examples of the via-hole electrode portion 23a having such a form are illustrated in FIGS. 12A to 12F. FIGS. 12A to 12E are cross-sectional views illustrating embodiments in which the via-hole electrode portion 23a is, on both sides of the cross-section in the width direction thereof, not in contact with the inner wall of the connection hole and thus defines a void. FIG. 12(F) is a cross-sectional view illustrating an embodiment in which a via-hole electrode portion 23a is, on one side of the cross-section in the width direction thereof, not in contact with the inner wall of the connection hole and thus defines a void.

The via-hole electrode portions 23a and 23b are disposed so as to cover therewith almost the entire exposed surface of the bump 14p and the conductive pattern 13 from the bottom of the via-holes 19a and 19b so that penetration of an etchant used for the formation of the via-hole electrode portions 23a and 23b and other impurities into the connection interface between the via-hole electrode portions 23a and 23b and bump 14 and conductive pattern 13 can be prevented effectively and sufficient wire strength can be secured. This makes it possible to heighten the reliability of electrical connection and at the same time reduce the connection resistance at the via-hole connection portion. In the embodiment shown in FIG. 12B, the inner walls of the via-holes 19a and 19b in the vicinity of the bottom are in contact with the via-hole electrodes 23a and 23b over the whole circumference so that the entire exposed surfaces of the bump 14 and conductive pattern 13 are covered with them more effectively. Not only the bump 14 and conductive pattern 13 but also side walls of the via-holes 19a and 19b are covered with the via-hole electrode portions 23a and 23b so that corrosion of a conductor due to penetration of water or the like from above, if any, can be prevented.

It was presumed that when the opening end portion of a connection hole is not covered completely with a wiring layer, deterioration in the reliability of electrical connection or increase in the resistance at the connection portion may occur. In order to completely cover the opening end portion of a connection hole to prevent occurrence of them even if there occurs misalignment between the connection hole and a wiring layer to be formed, there is a tendency to employ a pattern design of making the width of the wiring layer greater than the diameter of the connection hole.

According to the finding of the present inventors, not a covering ratio of the opening end portion of the connection hole but a covering ratio of the surface of a body to be wired which is exposed from the bottom wall of the connection hole has an influence on the reliability of electrical connection or resistance at the via-hole connection portion.

The entire exposed surface of the body to be wired can be covered with the wiring layer by, when the wiring layer is formed by the subtractive process as described in the above-described manufacturing example, adjusting etching conditions at the time when the conductive layer 21 other than the wiring pattern portion is selectively removed by etching (FIG. 11) and terminating etching before etching for the removal of the conductive layer 21 reaches the conductive pattern 13 and bump 14p. Even if there occurs misalignment in the position of the wiring layer thus formed, the entire exposed surface of the body to be wired can be covered by the wiring layer by determining the etching conditions such as etching amount as needed in consideration of the expected misalignment.

Figure 13:
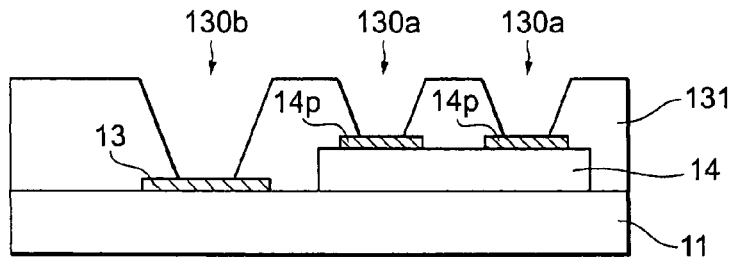
FIG. 13 illustrates manufacturing steps of another process for forming the wiring structure of the present invention.
Figure 13:
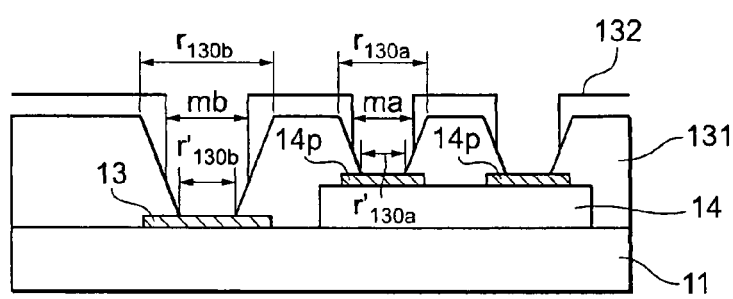
Figure 13:
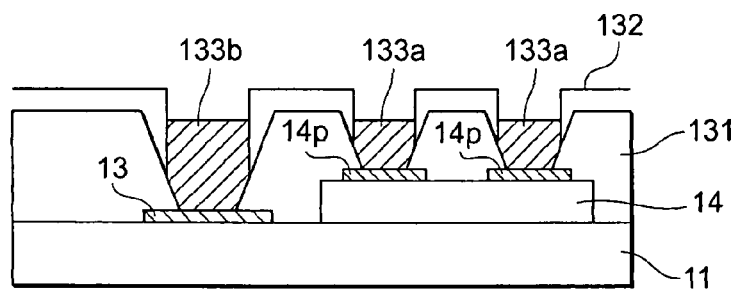
Figure 13:
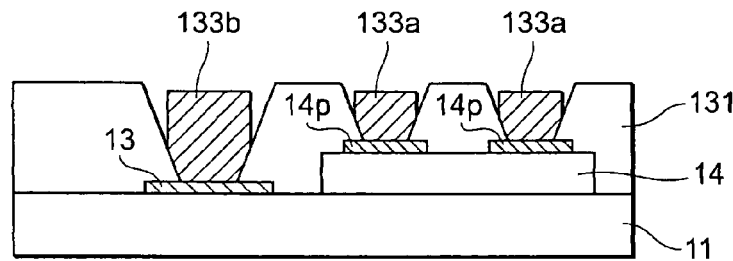

When the wiring structure is formed by the additive process as shown later in FIG. 13, it is recommended to make the opening widths ma and mb of a mask layer 132, which is formed in portions other than wiring patterns (FIG. 13B), greater than the diameters $r'_{130a}$ and $r'_{130b}$ (diameters of the bottom walls of the via-holes) of the exposed surfaces of the bodies to be wired. It is also recommended to determine the opening widths ma and mb of the mask layer 132 to be greater than the diameters $r'_{130a}$ and $r'_{130b}$ of the exposed surfaces of the bodies to be wired so as to allow a margin for the expected misalignment, whereby the entire exposed surface of the body to be wired can be covered with the wiring layer even if there occurs misalignment in the position where the wiring layer is formed.

One example of manufacturing processes using an additive process (a process of selectively forming a wiring layer in a wiring pattern portion) will next be described referring to some drawings, as another example of manufacturing a wiring structure according to the present invention. FIG. 13A to FIG. 13D illustrate another example of the fabrication steps of the wiring structure of the present invention.

A multilayer printed wiring board having an insulating layer 131 in which connection holes 130a and 130b have been formed to expose portions of the upper surface of an internal wiring layer which is a body to be wired is prepared (FIG. 13A).

A mask layer 132 made of a photoresist is then formed over portions other than wiring patterns (FIG. 13B). In order to avoid contact of the both side surfaces of a wiring layer with the upper inner walls of the connection holes, opening widths ma and mb of the mask layer 132 are made smaller than the upper opening diameters $r'_{130a}$ and $r'_{130b}$ of the connection holes 130a and 130b. After formation of wiring layers 133a and 133b by electroless plating (FIG. 13C), the mask layer 132 over the wiring patterns is removed by using a stripping solution, whereby wiring layers 133a and 133b are formed so as to define a void including an opening end of the connection hole between the both inner walls of the connection hole (FIG. 13D: wiring layer connection step).

The semiconductor-embedded substrate having a wiring structure obtained in such a manner exhibits similar advantages to those available by the semiconductor-embedded substrate 1 illustrated in FIG. 1.

As described above, the present invention is not limited to the above-described embodiments but can be modified in various ways without changing the scope of the invention. For example, the wiring structure of the present invention is not limited to a single layer structure having a wiring layer as the uppermost layer but can be applied to a multilayer structure fabricated by a known buildup technology conventionally employed for the manufacture of a multilayer printed wiring board. In this case, a void defined between the via-holes 19*a* and 19*b* and via-hole electrode portions 23*a* and 23*b*, respectively, in FIG. 1 may be filled with an insulating layer formed thereover. In addition, the body to be wired in the present invention is not limited to the conductive pattern 13 or bump 14*p* of a semiconductor device but it embraces all the bodies to be wired such as electrodes of electronic components such as resistor and capacitor to be connected to a wiring layer.

Moreover, in the wiring structure of the present invention, the positional relationship between the body to be wired be connected to the wiring layer and another component is not limited to those present on different planes in the same resin layer 16. Alternatively, they may be placed on the same plane or different planes in the same layer or may be placed on different layers.

The conductive pattern 22 which is a wiring layer is required not to be in contact with at least a portion of the inner wall of the via-holes 19*a* and 19*b* communicated with the upper surface of the resin layer 16. They may be not in contact with the inner wall only on the widthwise one side of the wiring layer, which means that a void is formed only on one side of the wiring layer. From the viewpoint of maintaining insulation, however, the wiring layer is desirably not in contact with the inner wall of the connection hole on the widthwise both sides of the wiring layer.

The cross-sectional shape of the via-hole electrode portions 23*a* and 23*b* is not limited to a hexagonal shape as illustrated in the drawings, but they may widen toward the body to be wired without stopping the widening on their way so as to increase their cross-sectional area. They have any shape insofar as they define a space including opening ends of the via-holes 19*a* and 19*b* between the inner walls of the via-holes 19*a* and 19*b* and side walls of the via-hole electrode portions 23*a* and 23*b* (refer to the above FIGS. 12A to 12F). In addition, the upper surface of the via-hole electrode portions 23*a* and 23*b* is not limited to a flat shape but may have, for example, convex portions or concave portions, or may be steepled. The upper surface is not limited to be parallel to the substrate surface, but may be, for example, inclined.

In the above-described manufacturing example, the wiring layer is formed so as to define a void at the upper portion of the inner walls of the via-holes 19*a* and 19*b* which are connection holes by adjusting the width of the resist layers 24*a* and 24*b* in the wiring layer formation step. Alternatively, a wiring layer once formed may be subjected to post process, for example, exposure to laser in order to trim a contact portion between the wiring layer and inner wall of the connection hole. From the viewpoint of simplifying the manufacturing steps, it is desired not to add a post process but to directly form a wiring layer not in contact with at least a portion of the inner wall of the connection hole. In the above-described manufacturing example, a subtractive process or additive process is used for the formation of a wiring layer, but a semi-additive process can also be employed.

As described above, according to the wiring structure, manufacturing method of the same and printed wiring board of the present invention, it is possible to connect a wiring layer to a body to be wired completely while keeping insulation between two adjacent wiring layers and thereby realize high density packaging due to decrease in pitch. They can therefore be applied widely and effectively to apparatuses, equipment, systems and various devices equipped therein with active components such as semiconductor devices and/or passive components such as resistor and capacitor, particularly, those which need miniaturization and performance enhancement.

What is claimed is:

1. A wiring structure comprising: an insulating layer having an upper surface, a lower surface, and a connection hole communicating between the upper and bottom surfaces, the connection hole including a bottom at the lower surface and an opening at the upper surface; a body to be wired that is placed below the lower surface or at the bottom inside the connection hole so as to expose at least a portion thereof from the bottom of the connection hole, and a conductive pattern that is patterned inside and outside of the connection hole and that has an electrode portion disposed inside the connection hole and connected to the body to be wired, wherein a cross-sectional area of the electrode portion increases toward the body to be wired and the electrode portion is disposed to contact at least a portion of an inner wall of the connection hole and so as to define a space region between the electrode portion and the inner wall of the connection hole in which at least a portion of the inner wall of the connection hole and the electrode portion are not in contact, and wherein an uppermost point of the electrode portion is below the opening of the connection hole.

2. The wiring structure according to claim 1, wherein a width of an upper portion of the electrode portion is smaller than an opening diameter of the connection hole.

3. The wiring structure according to claim 1, wherein the electrode portion is disposed so as to cover the entire exposed surface of the body to be wired that is exposed from the bottom of the connection hole.

4. The wiring structure according to claim 1, wherein the conductive pattern including the electrode portion is formed of Cu.

5. The wiring structure according to claim 1, wherein the conductive pattern including the electrode portion is formed by plating.

6. The wiring structure according to claim 1, wherein the electrode portion has a flat upper surface distal from the body to he wired, and the cross-sectional area of the electrode portion increases from the flat upper surface toward the body to be wired.

7. The wiring structure according to claim 1, wherein an upper portion of the electrode portion includes a flat upper surface and side surfaces, the flat upper surface is distal from the body to be wired, the upper portion has a trapezoidal cross section, and the sides are not in contact with the inner wall of the connection hole.

8. The wiring structure according to claim 2, wherein the electrode portion is disposed so as to cover the entire exposed surface of the body to be wired that is exposed from the bottom of the connection hole.

9. A printed wiring board comprising a plurality of wiring structures formed therein, the wiring structures each comprising: an insulating layer having an upper surface, a lower surface, and a connection hole communicating between the upper and bottom surfaces, the connection hole including a bottom at the lower surface and an opening at the upper surface; a body to be wired that is placed below or at the bottom inside the insulating layer so as to expose at least a portion from the bottom of the connection hole; and a conductive pattern that is patterned inside and outside of the connection hole and that has an electrode portion disposed inside the connection hole and connected to the body to be wired, wherein a cross-sectional area of the electrode portion increases toward the body to be wired, the electrode portion is disposed to contact at least a portion of an inner wall of the connection hole and so as to define a space region between the electrode portion and the inner wall of the connection hole in which at least a portion of the inner wall of the connection hole and the electrode portion are not in contact, and an upper-most point of the electrode portion is below the opening of the connection hole.

10. The printing wiring board according to claim 9, wherein the conductive pattern including the electrode portion is formed of Cu.

11. The printing wiring board according to claim 9, wherein the conductive pattern including the electrode portion is formed by plating.

12. The printing wiring board according to claim 9, wherein the electrode portion has a flat upper surface distal from the body to be wired, and the cross-sectional area of the electrode portion increases from the flat upper surface toward the body to be wired.

13. The printing wiring board according to claim 9, wherein an upper portion of the electrode portion includes a flat upper surface and side surfaces, the flat upper surface is distal from the body to be wired, the upper portion has a trapezoidal cross section, and the sides are not in contact with the inner wall of the connection hole.

14. A method for manufacturing a wiring structure, which comprises: an insulating layer formation step for forming an insulating layer on a body to be wired, the insulating layer having an upper surface and a lower surface, a connection hole formation step for forming at least one connection hole in the insulating layer so as to expose at least a portion of the body to be wired from the connection hole, the connection hole including a bottom at the lower surface and an opening at the upper surface and communicating between the upper and bottom surfaces, and a conductive pattern formation step for forming, by patterning, a conductive pattern that is patterned inside and outside of the connection hole and that has an electrode portion disposed inside the connection hole and connected to the body to be wired, wherein in the conductive pattern formation step, the electrode portion is formed to have a cross-sectional area that increases toward the body to be wired inside the connection hole and in contact with at least a portion of an inner wall of the connection hole and to define a space region between the electrode portion and the inner wall of the connection hole in which an inner wall of the connection hole is not in contact with the electrode portion, and the electrode portion is formed to have an upper-most point below the opening of the connection hole.

15. The method according to claim 14, wherein the conductive pattern including the electrode portion is formed of Cu.

16. The method according to claim 14, wherein the conductive pattern including the electrode portion is formed by plating.

17. The method according to claim 14, wherein the electrode portion has a flat upper surface distal from the body to be wired, and the cross-sectional area of the electrode portion increases from the flat upper surface toward the body to be wired.

18. The method according to claim 14, wherein an upper portion of the electrode portion includes a flat upper surface and side surfaces, the flat upper surface is distal from the body to be wired, the upper portion has a trapezoidal cross section, and the sides are not in contact with the inner wall of the connection hole.

* * * * *